United States Patent
Hasegawa et al.

(10) Patent No.: US 12,205,798 B2
(45) Date of Patent: Jan. 21, 2025

(54) HIGH-FREQUENCY POWER SUPPLY APPARATUS

(71) Applicant: DAIHEN Corporation, Osaka (JP)

(72) Inventors: Yuichi Hasegawa, Osaka (JP); Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 101 days.

(21) Appl. No.: 18/086,344

(22) Filed: Dec. 21, 2022

(65) Prior Publication Data
US 2023/0207269 A1   Jun. 29, 2023

(30) Foreign Application Priority Data
Dec. 28, 2021 (JP) ................. 2021-214823

(51) Int. Cl.
*H01J 37/32* (2006.01)
(52) U.S. Cl.
CPC .. *H01J 37/32183* (2013.01); *H01J 37/32128* (2013.01); *H01J 37/32165* (2013.01); *H01J 2237/24564* (2013.01); *H01J 2237/334* (2013.01)
(58) Field of Classification Search
CPC ............ H01J 37/32; H01J 37/32009; H01J 37/32082; H01J 37/321; H01J 37/32128; H01J 37/32155; H01J 37/32165; H01J 37/32174; H01J 37/32183; H01J 37/32211; H01J 37/32266
See application file for complete search history.

(56) References Cited

U.S. PATENT DOCUMENTS

| | | | |
|---|---|---|---|
| 9,030,101 B2 | 5/2015 | Valcore, Jr. et al. |
| 9,114,666 B2 | 8/2015 | Valcore, Jr. et al. |
| 9,171,699 B2 | 10/2015 | Valcore, Jr. et al. |
| 9,197,196 B2 | 11/2015 | Valcore, Jr. et al. |
| 9,236,228 B2 | 1/2016 | Valcore, Jr. et al. |
| 9,295,148 B2 | 3/2016 | Fong et al. |
| 9,320,126 B2 | 4/2016 | Valcore, Jr. et al. |
| 9,337,000 B2 | 5/2016 | Marakhtanov et al. |
| 9,368,329 B2 | 6/2016 | Valcore, Jr. et al. |

(Continued)

FOREIGN PATENT DOCUMENTS

| | | | |
|---|---|---|---|
| JP | 2017-188434 A | 10/2017 |
| JP | 2018-536295 A | 12/2018 |

*Primary Examiner* — Long Nguyen
(74) *Attorney, Agent, or Firm* — Rimon P.C.

(57) ABSTRACT

A high-frequency power supply apparatus includes the following elements. A first power supply supplies first power to a load by outputting a first voltage whose fundamental frequency is higher than a second voltage output by a second power supply. A period signal generation circuit generates a period signal matching a frequency and a phase of the second voltage. A waveform control circuit generates a modulation signal for performing frequency modulation on a fundamental wave signal of the first voltage, and adjusts an output timing of the modulation signal in accordance with a timing of the period signal. The first power supply generates a first frequency signal by performing frequency modulation on the fundamental wave signal of the first voltage by using the modulation signal. The first power supply performs power amplification on the first frequency signal and outputs, to the load, the first frequency signal as first power.

6 Claims, 4 Drawing Sheets

(56) References Cited

U.S. PATENT DOCUMENTS

| | | |
|---|---|---|
| 9,390,893 B2 | 7/2016 | Valcore, Jr. et al. |
| 9,401,264 B2 | 7/2016 | Marakhtanov et al. |
| 9,462,672 B2 | 10/2016 | Valcore, Jr. et al. |
| 9,502,216 B2 | 11/2016 | Valcore, Jr. et al. |
| 9,530,620 B2 | 12/2016 | Valcore, Jr. |
| 9,607,810 B2 | 3/2017 | Valcore, Jr. et al. |
| 9,620,334 B2 | 4/2017 | Lyndaker et al. |
| 9,620,337 B2 | 4/2017 | Valcore, Jr. et al. |
| 9,711,332 B2 | 7/2017 | Howald et al. |
| 9,720,022 B2 | 8/2017 | Howald et al. |
| 9,779,196 B2 | 10/2017 | Valcore, Jr. et al. |
| 9,812,294 B2 | 11/2017 | Valcore, Jr. et al. |
| 9,831,065 B2 | 11/2017 | Fong et al. |
| 9,831,071 B2 | 11/2017 | Howald et al. |
| 9,837,252 B2 | 12/2017 | Howald et al. |
| 9,842,725 B2 | 12/2017 | Valcore, Jr. et al. |
| 9,947,514 B2 | 4/2018 | Radomski et al. |
| 9,960,015 B2 | 5/2018 | Valcore, Jr. et al. |
| 9,997,333 B2 | 6/2018 | Valcore, Jr. et al. |
| 10,008,371 B2 | 6/2018 | Valcore, Jr. et al. |
| 10,032,605 B2 | 7/2018 | Valcore, Jr. et al. |
| 10,074,520 B2 | 9/2018 | Valcore, Jr. et al. |
| 10,128,090 B2 | 11/2018 | Valcore, Jr. et al. |
| 10,157,729 B2 | 12/2018 | Valcore, Jr. |
| 10,157,730 B2 | 12/2018 | Marakhtanov et al. |
| 10,163,605 B2 | 12/2018 | Fong et al. |
| 10,231,321 B2 | 3/2019 | Valcore, Jr. et al. |
| 10,249,476 B2 | 4/2019 | Marakhtanov et al. |
| 10,256,077 B2 | 4/2019 | Valcore, Jr. et al. |
| 10,276,350 B2 | 4/2019 | Howald et al. |
| 10,296,676 B2 | 5/2019 | Howald et al. |
| 10,304,669 B1 | 5/2019 | Coumou et al. |
| 10,319,570 B2 | 6/2019 | Valcore, Jr. et al. |
| 10,325,759 B2 | 6/2019 | Valcore, Jr. et al. |
| 10,340,127 B2 | 7/2019 | Valcore, Jr. et al. |
| 10,381,201 B2 | 8/2019 | Lyndaker et al. |
| 10,403,482 B2 | 9/2019 | Howald et al. |
| 10,469,108 B2 | 11/2019 | Howald et al. |
| 10,474,780 B2 | 11/2019 | Valcore, Jr. et al. |
| 10,621,265 B2 | 4/2020 | Howald et al. |
| 10,629,413 B2 | 4/2020 | Valcore, Jr. et al. |
| 10,707,056 B2 | 7/2020 | Valcore, Jr. et al. |
| 10,748,748 B2 | 8/2020 | Valcore, Jr. et al. |
| 10,762,266 B2 | 9/2020 | Valcore, Jr. et al. |
| 10,853,444 B2 | 12/2020 | Howald et al. |
| 10,911,081 B2 | 2/2021 | Howald et al. |
| 11,361,942 B2 * | 6/2022 | Valcore, Jr. .............. H05H 1/46 |
| 2016/0268100 A1 | 9/2016 | Vaicore, Jr. et al. |
| 2017/0062187 A1 | 3/2017 | Radomski et al. |
| 2018/0323038 A1 | 11/2018 | Valcore, Jr. et al. |
| 2019/0318919 A1 | 10/2019 | Lyndaker et al. |
| 2023/0207268 A1 * | 6/2023 | Ueno ................ H01J 37/32155 315/111.21 |

* cited by examiner

HIGH-FREQUENCY POWER SUPPLY APPARATUS

CROSS-REFERENCE TO RELATED APPLICATIONS

This application is based upon and claims the benefit of priority from Japanese Patent Application No. 2021-214823, filed on Dec. 28, 2021, the entire contents of which are incorporated herein by reference.

FIELD

The present disclosure relates generally to a high-frequency power supply apparatus.

BACKGROUND

A high-frequency power supply apparatus has been known, which is configured to simultaneously input power with two different frequencies to a plasma generation apparatus (for example, JP 2018-536295 A, JP 2017-188434 A, U.S. Pat. No. 10,304,669 B1). Such a high-frequency power supply apparatus minimizes reflected wave power by means of an impedance automatic matching function for each of high-frequency power and low-frequency power.

In a case where the high-frequency power supply apparatus simultaneously inputs high-frequency voltages with two different frequencies to a plasma generation apparatus, InterModulation Distortion (IMD) occurs in a high-frequency voltage (first voltage) on a high frequency side (first frequency side) due to the influence of a high-frequency voltage (second voltage) on a low frequency side (second frequency side). In other words, the first voltage varies with the second voltage, and thereby reflected wave power arises. A variation in the reflected wave power, which is attributed to IMD, is faster than a response of the impedance automatic matching function of the high-frequency power supply apparatus. Therefore, in a case where IMD occurs, it has been difficult for the high-frequency power supply apparatus to reduce high-frequency reflected wave power to sufficiently-small power even by using the impedance automatic matching function.

In addition, it is considered to reduce reflected wave power on the high frequency side by cancelling out IMD by outputting the first voltage after performing frequency modulation using a signal synchronized with the second voltage. Nevertheless, a second power supply that outputs the second voltage and a first power supply that outputs the first voltage are operated by different system clocks. Thus, it has been conventionally difficult for the first power supply side to perform frequency modulation at a timing synchronized with a frequency and a phase of the second voltage. It is also considered to transmit a timing signal generated by the second power supply to the first power supply by using a cable. In this case, however, a configuration becomes complicated and cost becomes higher.

SUMMARY

A high-frequency power supply apparatus according to the present disclosure includes a first power supply, a second power supply, a first matching circuit, a second matching circuit, a detection circuit, a period signal generation circuit, and a waveform control circuit. The first power supply is configured to supply first power to a load by outputting a first voltage with a first fundamental frequency. The second power supply is configured to supply second power to the load by outputting a second voltage with a second fundamental frequency being lower than the first fundamental frequency. The first matching circuit is connected between the first power supply and the load. The second matching circuit is connected between the second power supply and the load. The detection circuit is configured to output a detection signal representing the first voltage.

The period signal generation circuit is configured to generate a period signal matching a frequency and a phase of the second voltage. The period signal is generated by performing predetermined processing after generating a square signal by squaring the detection signal.

The a waveform control circuit is configured to generate a modulation signal for performing frequency modulation on a fundamental wave signal of the first voltage, and adjust an output timing of the modulation signal in accordance with a timing of the period signal. The first power supply is further configured to generate a first frequency signal by performing frequency modulation on a fundamental wave signal of the first voltage by using the modulation signal, perform power amplification on the first frequency signal, and output, to the load, the first frequency signal as first power.

DETAILED DESCRIPTION

Figure 1:
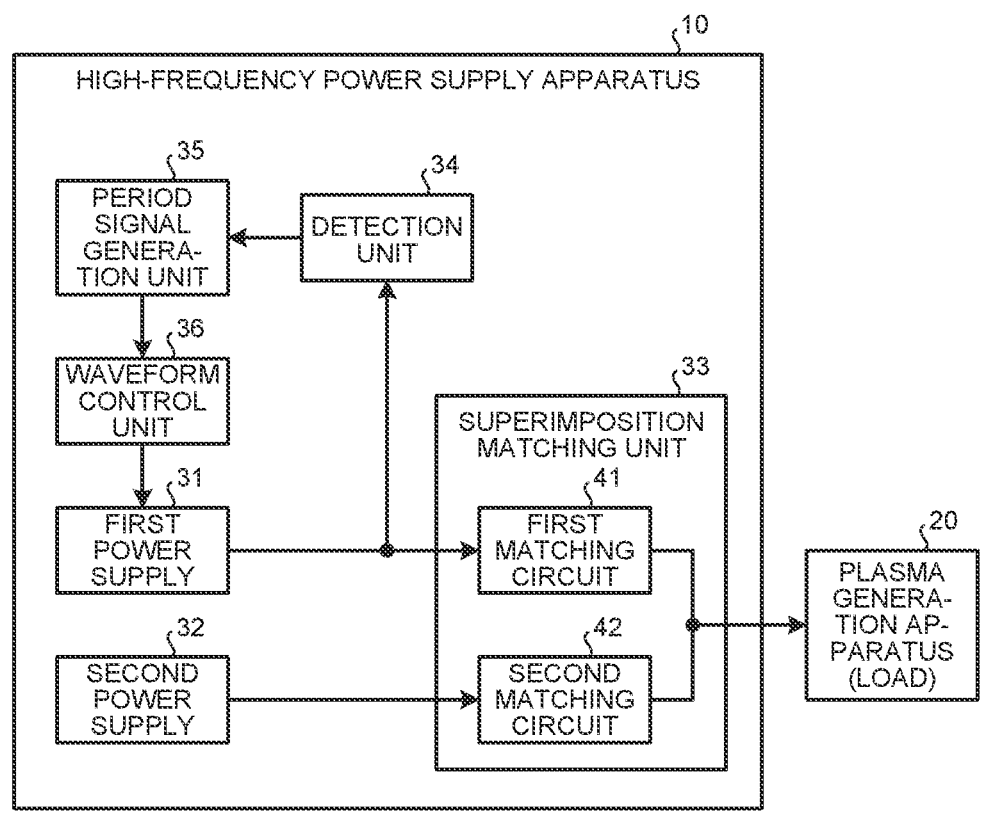
FIG. 1 is a diagram illustrating a configuration of a high-frequency power supply apparatus according to an embodiment together with a plasma generation apparatus.

Hereinafter, embodiments of the present disclosure will be described. FIG. 1 is a diagram illustrating a configuration of a high-frequency power supply apparatus 10 according to an embodiment together with a plasma generation apparatus 20. The high-frequency power supply apparatus 10 supplies the plasma generation apparatus 20 with power obtained by superimposing power with a first frequency (first fundamental frequency) and power with a second frequency (second fundamental frequency). The second frequency is lower than the first frequency. The first frequency is 40 MHz, for example. The first frequency may be a frequency in a Radio Frequency (RF) band for industrial use, such as 13.56 MHz and 27.12 MHz. The second frequency is 400 kHz, for example. The second frequency is another frequency in some cases. In addition, the high-frequency power supply apparatus 10 may supply power to an apparatus other than the plasma generation apparatus 20 as a load.

The plasma generation apparatus 20 supplies gas into a vacuum chamber and performs plasma gasification of the gas by using power with the first frequency, which has been supplied by the high-frequency power supply apparatus 10. Together with this, the plasma generation apparatus 20 accelerate ions by power with the second frequency, which has been supplied by the high-frequency power supply apparatus 10, and performs etching on a wafer arranged in the vacuum chamber.

The high-frequency power supply apparatus 10 supplies power while automatically adjusting an output impedance in such a manner as to minimize reflected wave power by means of an impedance automatic matching function for each of the power with the first frequency and the power with the second frequency. The high-frequency power supply apparatus 10 is thereby able to efficiently supply power to the plasma generation apparatus 20 by matching an output impedance with an impedance of the plasma generation apparatus 20 serving as a load.

The plasma generation apparatus 20 changes a plasma generation position in a facing direction of positive and negative two electrodes in the vacuum chamber in accordance with a period of the power with the second frequency. As a result, capacitance of a virtual capacitor formed between the positive and negative two electrodes changes with the period of the power with the second frequency. The change in capacitance is at high speed. Thus, the high-frequency power supply apparatus 10 cannot cause output impedance for the first frequency to follow the change of capacitance, even if using the impedance automatic matching function. The high-frequency power supply apparatus 10 therefore causes InterModulation Distortion (IMD) attributed to power with the second frequency to arise in power with the first frequency. Nevertheless, the high-frequency power supply apparatus 10 according to an embodiment of the present disclosure generates a period signal synchronized with such IMD, by detecting a voltage of the first power. Then, the high-frequency power supply apparatus 10 supplies power having the first frequency by performing, on the basis of the generated period signal, frequency modulation on a signal for cancelling out a change in reflected wave power that is attributed to the IMD. The high-frequency power supply apparatus 10 can thereby efficiently supply power to the plasma generation apparatus 20 by reducing reflected wave power with the first frequency.

The high-frequency power supply apparatus 10 includes, a first power supply 31, a second power supply 32, a superimposition matching unit 33, a detection unit 34, a period signal generation unit 35, and a waveform control unit 36.

The first power supply 31 supplies the first power to a load by outputting a first voltage with a first frequency (first fundamental frequency). More specifically, the first power supply 31 amplifies a voltage signal (first frequency signal), which is obtained by performing frequency modulation on a voltage signal (fundamental wave signal) having a sinusoidal waveform with the first frequency by using a voltage signal (modulation signal) having a sinusoidal waveform with the second frequency. The first power supply 31 then outputs the amplified voltage signal as the first power. The output first power is supplied to the load. A phase of a voltage signal with the second frequency against a voltage signal with the first frequency is controlled by the waveform control unit 36.

The second power supply 32 supplies second power to the load by outputting a second voltage with the second frequency (second fundamental frequency) being lower than the first frequency (first fundamental frequency).

Note that a high-frequency voltage output from the first power supply 31 toward the load will be referred to as a first progressive wave voltage, and a high-frequency voltage reflected from the load side back to the first power supply 31 will be referred to as a first reflected wave voltage. A high-frequency voltage output from the second power supply 32 toward the load will be referred to as a second progressive wave voltage, and a high-frequency voltage reflected from the load side back to the second power supply 32 will be referred to as a second reflected wave voltage.

The superimposition matching unit 33 receives the first power output from the first power supply 31 and receives the second power output from the second power supply 32. The superimposition matching unit 33 superimposes the first power and the second power while matching an impedance with an impedance of the plasma generation apparatus 20 serving as a load, for each of the first power and the second power. The superimposition matching unit 33 then supplies the superimposed power to the plasma generation apparatus 20.

The superimposition matching unit 33 includes, for example, a first matching circuit 41 and a second matching circuit 42. The first matching circuit 41 receives the first power from the first power supply 31. the first matching circuit 41 supplies the first power to the plasma generation apparatus 20 while automatically adjusting an impedance in the first matching circuit 41 to minimize reflected wave power or a reflection coefficient respect to an impedance component of the first frequency. The second matching circuit 42 receives the second power from the second power supply 32. the second matching circuit 42 supplies the second power to the plasma generation apparatus 20 while automatically adjusting an output impedance to minimize reflected wave power with respect to an impedance component of the second frequency.

The detection unit 34 outputs a detection signal representing a voltage of the first power output from the first power supply 31. More specifically, the detection unit 34 detects a voltage applied between the first power supply 31 and the superimposition matching unit 33, and outputs a detection signal representing the detected voltage. The detection unit 34 is, for example, a voltage measuring device. In addition, the detection unit 34 may output a detection signal representing a voltage of progressive waves that are detected via a directional coupler and are heading toward the superimposition matching unit 33 from the first power supply 31.

The period signal generation unit 35 generates a square signal by squaring a detection signal and then generates a period signal in which direct-current components and frequency components equal to or larger than a double of the first frequency in the generated square signal have been removed. A component of IMD attributed to a voltage of the second power, which is included in a voltage of the first power, is also included as an amplitude component for a fundamental wave of the voltage of the first power. The period signal generation unit 35 detects an amplitude component for a fundamental wave of the voltage of the first power by means of heterodyne detection by generating a square signal of a detection signal. Accordingly, the period signal generation unit 35 is able to generate a period signal synchronized with a component of IMD attributed to a fundamental wave of the voltage of the second power that is included in the fundamental wave of the voltage of the first power.

Figure 2:
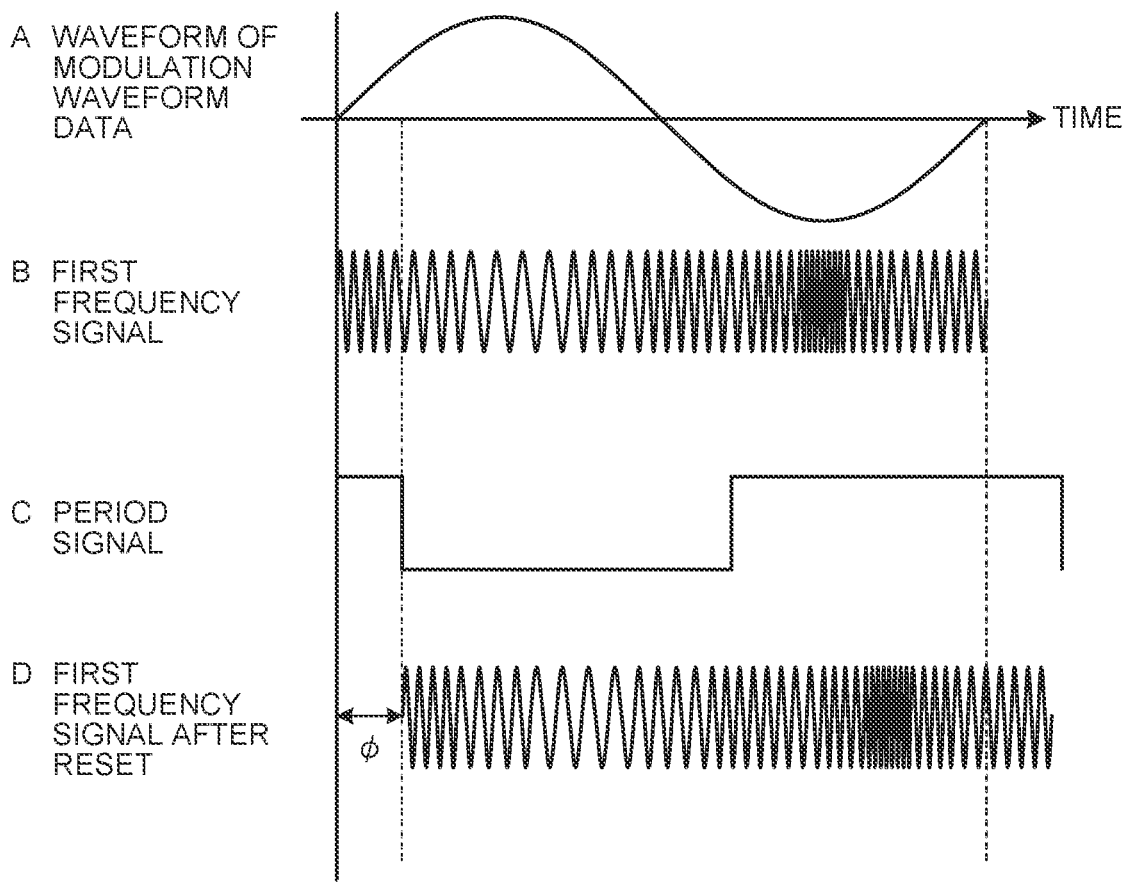
FIG. 2 is a diagram illustrating an example of modulation waveform data and a first frequency signal.

FIG. 2 is a diagram illustrating an example of modulation waveform data and a first frequency signal.

The waveform control unit 36 generates a modulation signal for performing frequency modulation on the fundamental wave of the voltage of the first power. This modulation signal is generated on the basis of modulation waveform data stored in a memory.

As illustrated in A of FIG. 2, the modulation waveform data is sinusoidal waveform data in which amplitude information for one period of a frequency, which is the same as a frequency (second frequency) of the fundamental wave of a voltage of the second power, is stored at a predetermined phase interval.

The modulation waveform data is generated so as to reduce a reflection coefficient (reflected wave power) by cancelling out the component of IMD, which is included in the voltage of the first power, when the fundamental wave of the voltage of the first power is subjected to frequency modulation using a modulation signal. For this reason, a phase of first data in the modulation waveform data and an amplitude of the modulation waveform data are adjusted. In A of FIG. 2, a case where an amplitude of the first data in the modulation waveform data is 0 is exemplified. The modulation waveform data is appropriately updated.

Note that a phase interval of amplitude information in the modulation waveform data varies with a control cycle of the first power supply 31. For example, if the first power supply 31 operates in a control cycle of 100 MHz, a signal is divided into 250 (100 MHz/400 kHz), so that amplitude information at a phase interval of 1.44 degrees (360/250) is stored as modulation waveform data. If the first power supply 31 operates in a control cycle of 500 MHz, a signal is divided into 1250 (500 MHz/400 kHz), so that amplitude information at a phase interval of 0.288 degrees (360/1250) is stored as modulation waveform data. The control cycle is set on the basis of a system clock.

The waveform control unit 36 sequentially outputs, every control cycle, pieces of amplitude information included in the modulation waveform data to the first power supply 31. The first power supply 31 generates, by using the modulation waveform data, a first frequency signal (refer to B of FIG. 2) by performing frequency modulation on a fundamental wave signal output from a fundamental wave generation unit (not illustrated) in the first power supply 31. The first power supply 31 performs power amplification or the like on the first frequency signal and outputs, toward the load, the resultant first frequency signal as the first power. At this time, the waveform control unit 36 resets an output timing of the modulation waveform data in accordance with a timing of a period signal (refer to C of FIG. 2). In an example illustrated in D of FIG. 2, an output timing is shifted by φ in synchronization with a falling timing of the period signal. The waveform control unit 36 has a function of adjusting an output timing of modulation waveform data in synchronization with a timing of a predetermined phase of the period signal. Therefore, it can be said that the first frequency signal generated by the first power supply 31 is generated in accordance with the timing of the period signal.

With the configuration above, even if a timing of frequency modulation gets inconsistent due to a difference between the system clock of the first power supply 31 and the system clock of the second power supply 32, the inconsistency disappears at a timing at which the signal gets synchronized with the period signal. Thus, accurate control of frequency modulation can be performed. In other words, it is possible to effectively perform suppression of IMD.

In FIG. 1, the first power supply 31, the detection unit 34, the period signal generation unit 35, and the waveform control unit 36 are depicted as separated configurations for the sake of explanatory convenience. Nevertheless, in substance, the detection unit 34, the period signal generation unit 35, and the waveform control unit 36 are components of the first power supply 31, and control is performed on the basis of the same system clock.

Note that the waveform control unit 36 may include a signal generator that outputs an analog signal corresponding to modulation waveform data stored in a memory. In this case, the signal generator generates a signal with a waveform corresponding to modulation waveform data stored in a memory. In this manner, not only digital signal processing but also analog signal processing can be applied.

Figure 3:
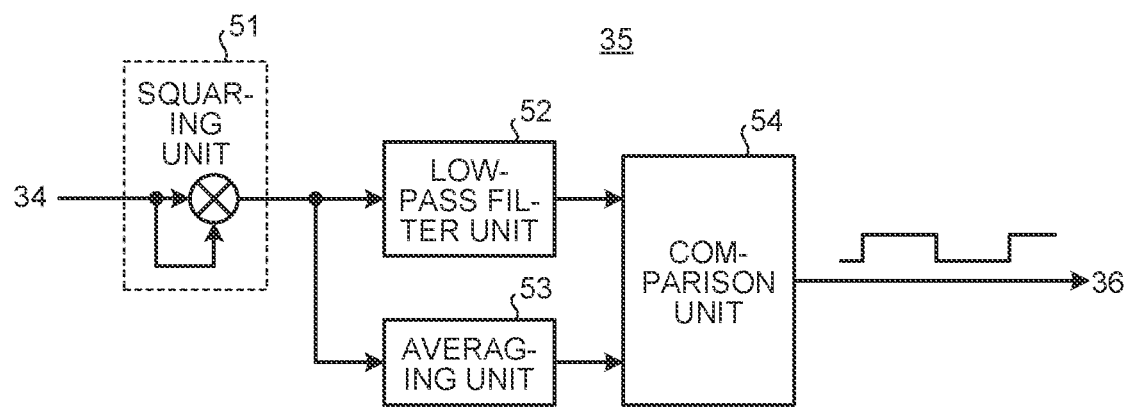
FIG. 3 is a diagram illustrating a first example of a configuration of a period signal generation unit.

FIG. 3 is a diagram illustrating a first example of a configuration of the period signal generation unit 35. The period signal generation unit 35 includes, for example, a squaring unit 51, a low-pass filter unit 52, an averaging unit 53, and a comparison unit 54, as illustrated in FIG. 3.

The squaring unit 51 generates a square signal by squaring a detection signal received from the detection unit 34. A signal obtained by squaring a sinusoidal signal with a frequency A is represented by the following Formula (1).

$$\sin^2(\theta) = \{\cos(\theta) - \cos(2\theta)\}/2 \qquad (1)$$

The $\cos(\theta)$ denotes an amplitude component for a fundamental wave of the voltage of the first power. The $\cos(2\theta)$ denotes a frequency component of a double of the fundamental wave of the voltage of the first power. Accordingly, a square signal output from the squaring unit 51 includes an amplitude component of the fundamental wave of the voltage of the first power that is included in a detection signal, and a component of a double frequency of the voltage of the first power.

The low-pass filter unit 52 receives a square signal from the squaring unit 51. The low-pass filter unit 52 outputs a high-frequency component removal signal that is obtained by filtering the square signal received from the squaring unit 51 by using a low-pass filter. This low-pass filter has frequency properties that causes components of the second frequency or less (for example, 400 kHz or less) to pass through and removes components of a double frequency of the first frequency.

The low-pass filter unit 52 is capable of removing a signal component corresponding to $\cos(2\theta)$ in Formula (1) from the square signal. That is, the low-pass filter unit 52 can output a high-frequency component removal signal representing a signal component corresponding to $\cos(\theta)$ in Formula (1) that is included in the square signal.

Therefore, the low-pass filter unit 52 can output a high-frequency component removal signal representing an amplitude component of a fundamental wave of a voltage of the first power that is included in a detection signal.

The averaging unit 53 receives the square signal from the squaring unit 51. The averaging unit 53 outputs an averaged signal obtained by averaging the square signals received from the squaring unit 51 by using an averaging filter. The averaging filter has properties that can average signals of the second frequency. For example, the averaging filter is a filter that averages a section of predetermined times of a period of a signal with the second frequency. For example, the averaging filter is a filter that moving-averages a section equal to or larger than four times of a period of a signal with the second frequency. Such an averaging unit 53 can output an averaged signal representing a direct-current component of the square signal, from which the influence of a signal with a frequency equal to or larger than the second frequency that is included in the square signal has been removed.

The comparison unit 54 receives a high-frequency component removal signal from the low-pass filter unit 52 and receives an averaged signal from the averaging unit 53. The comparison unit 54 outputs, as a period signal, a signal representing a comparison result obtained by comparing the averaged signal and the high-frequency component removal signal. For example, the comparison unit 54 outputs a binary period signal that indicates 1 or H logic in a case where the high-frequency component removal signal is larger than the averaged signal, and indicates 0 or L logic in a case where the high-frequency component removal signal is equal to or smaller than the averaged signal.

In a case where IMD occurs, an amplitude component of a fundamental wave of a voltage of the first power, which is included in a detection signal (that is, high-frequency component removal signal output from the low-pass filter unit 52), includes a direct-current component of a square signal and a component of the second frequency. The component of the second frequency, which is included in the high-frequency component removal signal, is a component arisen due to the influence of the second power output from the second power supply 32, and is also a signal matching a frequency and a phase of a voltage of the second power. The averaged signal represents a direct-current component of a square signal. Therefore, the comparison unit 54 can remove the direct-current component of the square signal from the high-frequency component removal signal by comparing the averaged signal and the high-frequency component removal signal. The comparison unit 54 can thereby output a period signal that matches a frequency and a phase of a voltage of the second power output from the second power supply 32.

As described above, the period signal generation unit 35 according to the first example can output a period signal that matches a frequency and a phase of a voltage of the second power output from the second power supply 32, by comparing the averaged signal and the high-frequency component removal signal.

Note that the squaring unit 51, the low-pass filter unit 52, the averaging unit 53, and the comparison unit 54 may each be whichever of an analog circuit and a digital circuit. In a case where the squaring unit 51, the low-pass filter unit 52, the averaging unit 53, and the comparison unit 54 are analog circuits, the period signal generation unit 35 receives an analog detection signal from the detection unit 34. In a case where the squaring unit 51, the low-pass filter unit 52, the averaging unit 53 and the comparison unit 54 are digital circuits, the period signal generation unit 35 receives a digital detection signal with a predetermined number of bits from the detection unit 34.

Figure 4:
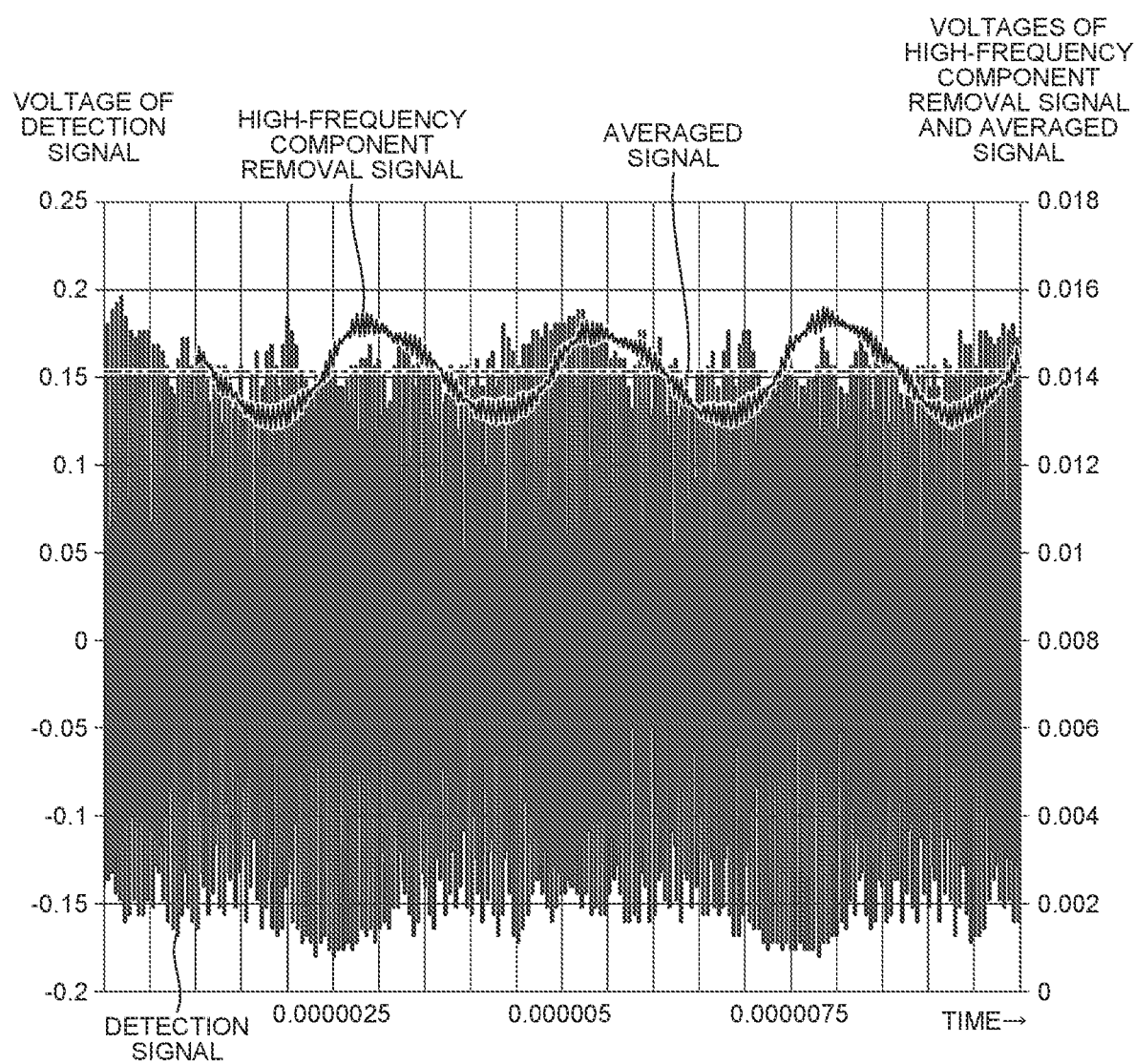
FIG. 4 is a diagram illustrating an example of a detection signal, a high-frequency component removal signal, and an averaged signal.

FIG. 4 is a diagram illustrating an example of a detection signal, a high-frequency component removal signal, and an averaged signal that are generated in a case where IMD has occurred. Note that, in FIG. 4, a horizontal axis indicates a time and a vertical axis indicates a voltage. In addition, a scale mark on a vertical axis on the left side in FIG. 4 indicates a voltage of a detection signal, and a scale mark on a vertical axis on the right side in FIG. 4 indicates a voltage of voltages of a high-frequency component removal signal and an averaged signal.

As illustrated in FIG. 4, in a case where IMD occurs, an amplitude component of a fundamental wave of a voltage of the first power of a detection signal includes a component of the second frequency due to the influence of the second power output from the second power supply 32. The high-frequency component removal signal represents an amplitude component of a fundamental wave of a voltage of the first power that is included in the detection signal. In addition, the high-frequency component removal signal varies to a positive side and a negative side over a centered averaged signal obtained by averaging a square signal obtained by squaring the detection signal. Accordingly, the comparison unit 54 can output a period signal that matches a frequency and a phase of a voltage of the second power output from the second power supply 32, by comparing the averaged signal and the high-frequency component removal signal.

Figure 5:
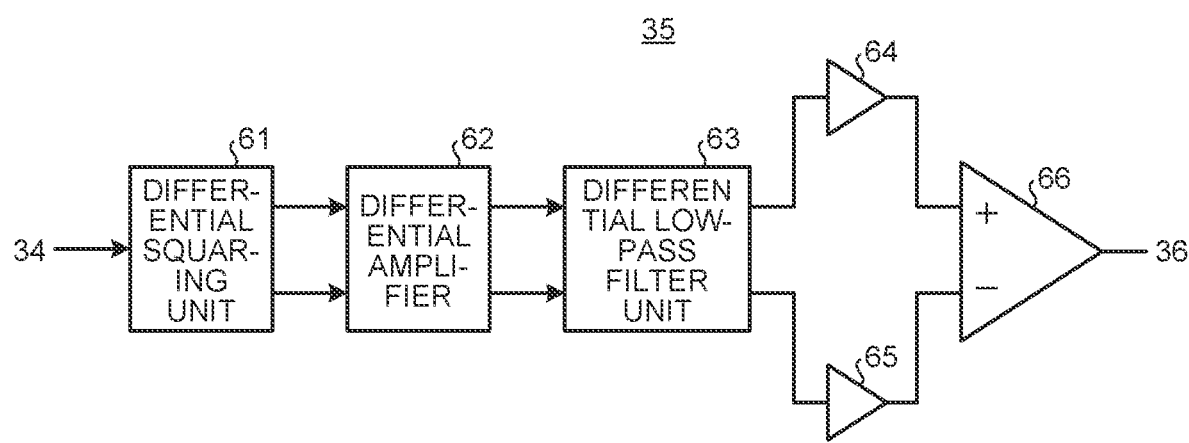
FIG. 5 is a diagram illustrating a second example of a configuration of a period signal generation unit.

FIG. 5 is a diagram illustrating a second example of a configuration of the period signal generation unit 35 The period signal generation unit 35 may have a configuration including, for example, a differential squaring unit 61, a differential amplifier 62, a differential low-pass filter unit 63, a first amplifier 64, a second amplifier 65, and a comparator 66, as illustrated in FIG. 5.

The differential squaring unit 61 generates a differential square signal by squaring a detection signal received from the detection unit 34. In the differential square signal, a difference between a signal on the positive side and a signal on the negative side indicates a square of the detection signal. Accordingly, in the differential square signal, a difference between a signal on the positive side and a signal on the negative side includes an amplitude component of a fundamental wave of a voltage of the first power, which is included in the detection signal, and also includes a component of a double frequency of the first frequency.

The differential amplifier 62 performs differential amplification on the differential square signal with a predetermined gain. The differential low-pass filter unit 63 receives, from the differential amplifier 62, a square signal amplified with the predetermined gain. The differential low-pass filter unit 63 outputs a differential high-frequency component removal signal obtained by filtering the differential square signal received from the differential amplifier 62 by using a differential low-pass filter. The differential low-pass filter causes components of the second frequency or less (for example, 400 kHz or less) to pass through and removes components of a double frequency of the first frequency. In the differential high-frequency component removal signal, a difference between a signal on the positive side and a signal on the negative side represents an amplitude component of a fundamental wave of a voltage of the first power that is included in the detection signal.

The first amplifier 64 amplifies the signal on the positive side in the differential high-frequency component removal signal with a predetermined gain. The second amplifier 65 amplifies the signal on the negative side in the differential high-frequency component removal signal with a predetermined gain. Note that the gain of the first amplifier 64 and the gain of the second amplifier 65 are the same as each other.

The comparator 66 receives the signal on the positive side in the differential high-frequency component removal signal that has been amplified by the first amplifier 64 with the predetermined gain, and also receives the signal on the negative side in the differential high-frequency component removal signal that has been amplified by the second amplifier 65 with the predetermined gain. The comparator 66 outputs, as a period signal, a signal representing a comparison result obtained by comparing the signal on the positive side in the differential high-frequency component removal signal and the signal on the negative side in the differential high-frequency component removal signal. For example, the comparator 66 outputs a binary period signal that indicates 1 or H logic in a case where the signal on the positive side is larger than the signal on the negative side, and indicates 0 or L logic in a case where the signal on the positive side is equal to or smaller than the signal on the negative side.

The signal on the positive side and the signal on the negative side in the differential signal are signals with the same amplitude and with inverted positive/negative signs. Accordingly, the comparator 66 can output a signal representing a signal component of the second frequency, by removing a direct-current component from an amplitude component of a detection signal, by comparing the signal on the positive side and the signal on the negative side in the differential high-frequency component removal signal. The comparator 66 can thereby output a period signal that matches a frequency and a phase of a voltage of the second power output from the second power supply 32.

As described above, the period signal generation unit 35 according to the second example can output a period signal that matches a frequency and a phase of a voltage of the second power output from the second power supply 32, by comparing the signal on the positive side and the signal on the negative side in the differential high-frequency component removal signal.

The high-frequency power supply apparatus 10 according to the above-described embodiment generates a period signal synchronized with IMD. Then, the high-frequency power supply apparatus 10 supplies power having the first frequency obtained by performing, on the basis of the generated period signal, frequency modulation on a signal for cancelling out a change in reflected wave power that is attributed to the IMD. The high-frequency power supply apparatus 10 according to the embodiment can thereby supply power efficiently to the plasma generation apparatus 20 serving as a load, by reducing reflected wave power having the first frequency.

Moreover, the high-frequency power supply apparatus 10 according to the embodiment generates a period signal synchronized with IMD, on the basis of a detection signal representing a voltage of the first power. The high-frequency power supply apparatus 10 according to the embodiment can thereby generate a period signal synchronized with IMD, with a simple configuration and without acquiring a timing signal from the second power supply 32 via a cable or the like. Accordingly, the high-frequency power supply apparatus 10 according to the embodiment can reduce reflected wave power with a simple configuration in the case of supplying power with two different frequencies to the plasma generation apparatus 20 serving as a load.

Heretofore, embodiments of the present disclosure have been described. However, those embodiments are presented as examples, and are not intended to limit the scope of the invention. Various changes can be made on the embodiments.

According to the present disclosure, it is possible, for example, to generate a period signal matching a frequency and a phase of the second voltage on the basis of a detection signal detected on a first power supply side. Therefore, even in a case where a system clock of a first power supply and a system clock of a second power supply are different, it is possible to perform frequency modulation for suppressing reflected wave power on the first power supply side, in synchronization with the frequency and the phase of the second voltage.

What is claimed is:

1. A high-frequency power supply apparatus comprising:
    a first power supply configured to supply first power to a load by outputting a first voltage with a first fundamental frequency;
    a second power supply configured to supply second power to the load by outputting a second voltage with a second fundamental frequency being lower than the first fundamental frequency;
    a first matching circuit connected between the first power supply and the load;
    a second matching circuit connected between the second power supply and the load;
    a detection circuit configured to output a detection signal representing the first voltage;
    a period signal generation circuit configured to generate a period signal matching a frequency and a phase of the second voltage, the period signal being generated by performing predetermined processing after generating a square signal by squaring the detection signal; and
    a waveform control circuit configured to
        generate a modulation signal for performing frequency modulation on a fundamental wave signal of the first voltage, and
        adjust an output timing of the modulation signal in accordance with a timing of the period signal,
    wherein the first power supply is further configured to
        generate a first frequency signal by performing frequency modulation on a fundamental wave signal of the first voltage by using the modulation signal,
        perform power amplification on the first frequency signal, and
        output, to the load, the first frequency signal as the first power.

2. The high-frequency power supply apparatus according to claim 1, wherein the period signal generation circuit includes:
    a squaring circuit configured to generate the square signal;
    a low-pass filter circuit configured to output a high-frequency component removal signal representing an amplitude component of a fundamental wave of a voltage of the first power;
    an averaging circuit configured to output an averaged signal obtained by averaging the square signal; and
    a comparison circuit configured to output, as the period signal, a signal representing a comparison result obtained by comparing the high-frequency component removal signal and the averaged signal.

3. The high-frequency power supply apparatus according to claim 1, wherein the period signal generation circuit includes:
    a differential squaring circuit configured to generate the differential square signal by squaring the detection signal;
    a differential low-pass filter circuit configured to output a high-frequency component removal signal representing an amplitude component of a fundamental wave of a voltage of the first power; and
    a comparator configured to output, as the period signal, a signal representing a comparison result obtained by comparing a signal on a positive side and a signal on a negative side in the high-frequency component removal signal.

4. The high-frequency power supply apparatus according to claim 1, wherein the waveform control circuit is configured to
    generate the modulation signal based on modulation waveform data, the modulation waveform data being constituted by pieces of amplitude information and being stored in a memory,
    sequentially output, every control cycle, the pieces of the amplitude information of the modulation waveform data, and
    adjust an output timing of the modulation waveform data to synchronize with a timing of a predetermined phase of the period signal.

5. The high-frequency power supply apparatus according to claim 2, wherein the waveform control circuit is configured to generate the modulation signal based on modulation waveform data, the modulation waveform data being constituted by pieces of amplitude information and being stored in a memory, sequentially output, every control cycle, the pieces of the amplitude information of the modulation waveform data, and adjust an output timing of the modulation waveform data to synchronize with a timing of a predetermined phase of the period signal.

6. The high-frequency power supply apparatus according to claim 3, wherein the waveform control circuit is configured to generate the modulation signal based on modulation waveform data, the modulation waveform data being constituted by pieces of amplitude information and being stored in a memory, sequentially output, every control cycle, the pieces of the amplitude information of the modulation waveform data, and adjust an output timing of the modulation waveform data to synchronize with a timing of a predetermined phase of the period signal.

* * * * *